United States Patent
Garrity et al.

(10) Patent No.: US 8,575,989 B1
(45) Date of Patent: Nov. 5, 2013

(54) HIGH ISOLATION SWITCH

(75) Inventors: Douglas A. Garrity, Gilbert, AZ (US); Chunhe Zhao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/545,774

(22) Filed: Jul. 10, 2012

(51) Int. Cl.
*H03K 17/00* (2006.01)

(52) U.S. Cl.
USPC .......................................... 327/404; 327/427

(58) Field of Classification Search
USPC ......... 327/427, 374–377, 403–405, 328–329, 327/419, 430, 434, 383, 379, 526, 581, 426, 327/436, 391; 326/113, 21–24; 333/103, 333/101
See application file for complete search history.

(56) References Cited

U.S. PATENT DOCUMENTS

| | | | |
|---|---|---|---|
| 5,422,588 A | 6/1995 | Wynne | |
| 7,746,152 B2 * | 6/2010 | Nakatani et al. | 327/389 |
| 7,999,512 B2 * | 8/2011 | Kwong et al. | 320/134 |
| 8,004,340 B2 | 8/2011 | Guo et al. | |
| 2010/0207679 A1 * | 8/2010 | Okashita | 327/436 |

OTHER PUBLICATIONS

Wikipedia, The Free Encyclopeida "Charge Pump" May 30, 2012; retrieved from the Internet on Jun. 28, 2012 at http://en.wikipedia.org/wiki/Charge_pump.

Wang, Tzu-Ming et al. "Design of Analog Output Buffer With Level Shifting Function on Glass Substrate for Panel Application" Journal of Display Technology, vol. 5, No. 9, Sep. 2009.

* cited by examiner

*Primary Examiner* — Lincoln Donovan
*Assistant Examiner* — Thomas Skibinski
(74) *Attorney, Agent, or Firm* — Ingrassia Fisher & Lorenz, P.C.

(57) ABSTRACT

A switch is provided. The circuit includes a plurality of transistors configured to electrically isolate the input of the switch from the output of the switch. In one embodiment, for example, the plurality of transistors may be configured to provide at least one path between the input and the output of the switch, and to provide at least three layers of electrical isolation between the input and the output of the switch when the switch is open.

18 Claims, 5 Drawing Sheets

US 8,575,989 B1

HIGH ISOLATION SWITCH

TECHNICAL FIELD

The following relates to circuits, and more particularly to switches.

BACKGROUND

Switches are used in a wide variety of environments for a wide variety of purposes. Some switches use moving parts to electrically connect, or electrically isolate, two sides of a circuit. Other types of switches use no moving parts and rely upon other factors to electrically connect, and electrically isolate, two sides of a circuit. One such switch is called an analog switch (otherwise known as a bilateral switch), which uses two metal-oxide-semiconductor field-effect transistors (MOSFETs). However, in some instances, analog switches may allow some current to pass through the switch when the switch is open (i.e., in an electrical isolation mode).

DESCRIPTION OF THE DRAWING FIGURES

Exemplary embodiments will hereinafter be described in conjunction with the following drawing figures, wherein like numerals denote like elements.

DETAILED DESCRIPTION

According to various exemplary embodiments, a switch is provided. In one embodiment, the switch includes a number of transistors to isolate the output of the switch from the input of the switch when the switch is supposed to be open. In some instances, for example, the switch may receive an input above a first reference voltage, such as a power supply voltage, or a voltage below a second reference voltage, such as a ground. The first reference voltage may be used to turn off, for example, a p-channel portion of the switch, and the second reference voltage may be used to turn off, for example, a n-channel portion of the switch. In prior switches, an input, for example, a below ground voltage such as negative two-hundred and fifty millivolts, might allow some current to flow through the switch even though the switch is supposed to be open. However, the configuration of the transistors, as discussed below, minimizes any current from bleeding through the switch which could affect other circuitry in a system, such as a sampling measurement system that includes an analog to digital converter (ADC). Furthermore, the configuration can allow for signals above the first reference voltage and/or below the second reference voltage to pass through the switch, as discussed in further detail below. Furthermore, the configuration only uses transistors, which minimizes the size of the switch.

Figure 1:
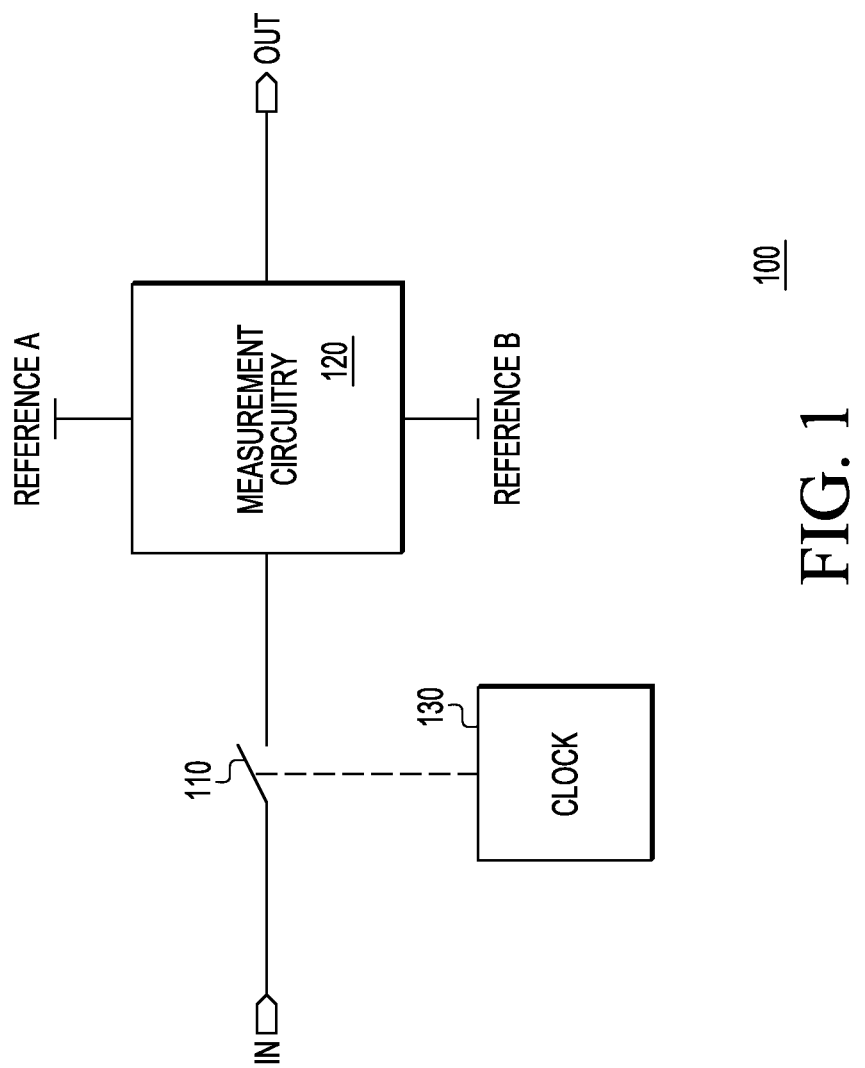
FIG. 1 illustrates a circuit for sampling input signals, in accordance with an embodiment.

FIG. 1 illustrates a circuit 100 for sampling input signals, in accordance with an embodiment. The circuit 100 includes a switch 110 coupled between an input to the circuit 100 and measurement circuitry 120. The measurement circuitry 120 may be coupled to a first reference voltage (Reference A) and a second reference voltage (Reference B). In one embodiment, for example, Reference A may be a power supply voltage and Reference B may be ground. The measurement circuitry 120 samples the input signal when the switch is closed and processes the sampled input when the switch is open. In one embodiment, for example, the switch 110 may be controlled by a clock 130, to periodically open and close, allowing the measurement circuitry 120 to sample the input signal. However, in some instances, the circuit 100 may need to sample signals above Reference A, below reference B, or both above Reference A and below reference B. Accordingly, the switch, when open, needs to minimize any current from flowing from the input to the measurement circuitry 120 which could corrupt the output of the circuit 100.

Figure 2:
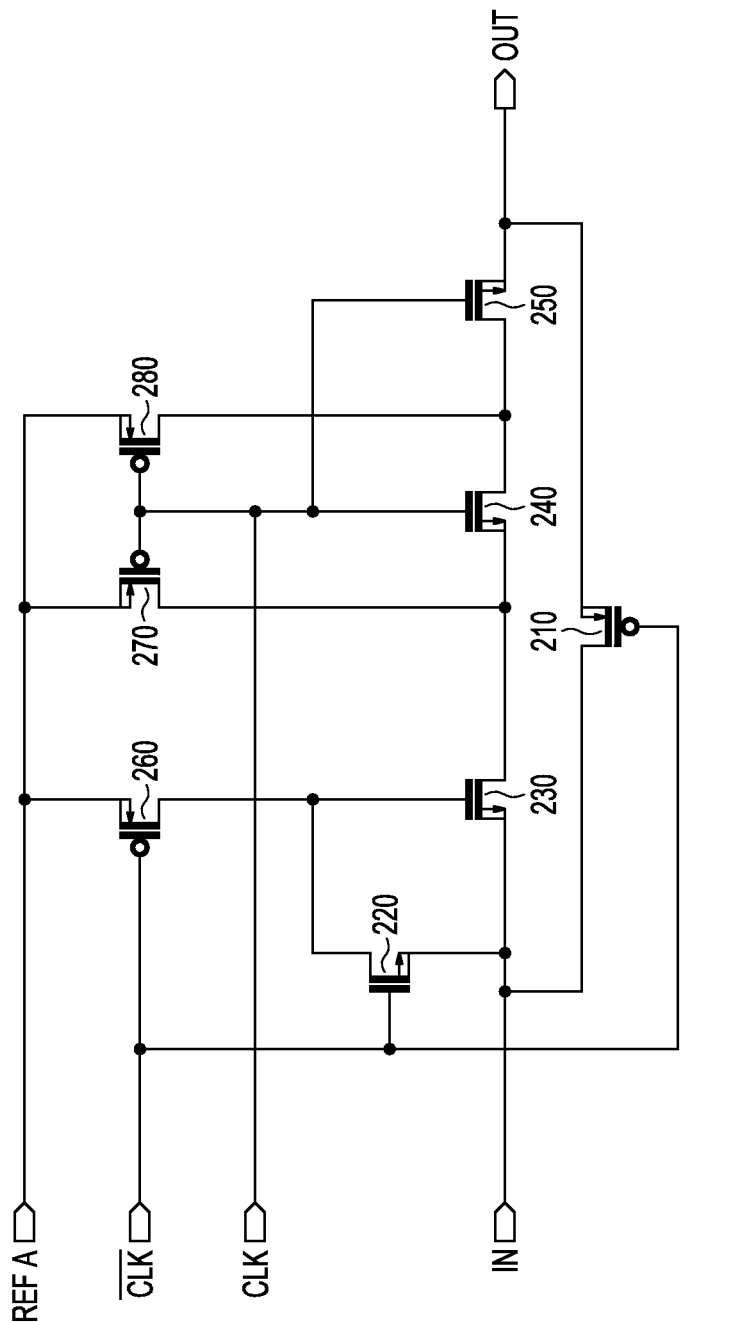
FIG. 2 is a circuit diagram illustrating a switch, in accordance with an embodiment.

FIG. 2 is a circuit diagram illustrating a switch 110 in accordance with an embodiment. The switch 110 may be used in a circuit 100 designed to sample signals below Reference A and below Reference B. The switch 110 includes transistors 210-280, each of the transistors 210-280 has a gate, a drain, a source, and a bulk connection. The gate may also be referred to as a control electrode and the source and drain may be referred to as a current electrodes. Complementary-Metal-Oxide-Semiconductor (CMOS) transistors including p-type (PMOS) and n-type (NMOS) transistors are typically used for transistors 210-280 although other types of transistors such as Junction-Field-Effect transistors (JFET) or bipolar junction transistors might also be used. A drain and source of transistor 210 is coupled between the input of the switch 110 and the output of the switch 110. A gate of the transistor 210 is coupled to an inverse of the clock signal (hereinafter referred to as clockbar or $\overline{CLK}$ in the figures).

Transistors 230, 240 and 250 are arranged in series between the input of the switch 110 and the output of the switch 110. A source of transistor 230 is coupled to the input signal. The drain of transistor 230 is coupled to a source of transistor 240. The drain of transistor 240 is coupled to the drain of transistor 250. Lastly, the source of transistor 250 is coupled to the output of the switch 110.

Transistor 220 is coupled between a gate of transistor 230 and the input to the switch 110. A gate of the transistor 220 is also coupled to clockbar. Transistor 260 is coupled between Reference A and the gate of transistor 230. The gate of transistor 260 is coupled to clockbar. Transistor 270 is coupled between Reference A and the drain of transistor 230. Transistor 280 is coupled between Reference A and the drains of transistors 240 and 250. The gates of transistors 240, 250, 270 and 280 are coupled to the clock control signal (CLK). In another embodiment, for example, if the input signals to the switch 110 were all centered about ground and were relatively small, transistor 210 could be omitted from the switch 110.

In operation, the switch 110 is closed (i.e., allowing current to flow between the input and the output of the switch 110) when the clock control signal is high and clockbar is low. When the clock control signal is high, transistors 230, 240 and 250 are conducting, passing signals from the input of the switch to the output of the switch, including signals that may have a voltage below Reference B. Transistor 260 is also turned on and is used to connect the gate of transistor 230 to Reference A so that transistor 230 is turned on fully. Transistor 210 may also conduct, passing signals from the input of the switch to the output of the switch, if the amplitude of the input signal is close to the Reference A voltage. In this stage, transistors 220, 270 and 280 are all off (i.e., not conducting).

The switch 110 is opened when the clock control signal goes low and clockbar goes high. In this stage, transistors 210, 230 and 260 are turned off such that the switch 110 is not passing the input signal to the output, providing a first layer of isolation between the input and the output of the switch 110. Furthermore, transistors 270 and 280 are turned on and are conducting such that the source and the drain of transistor 240 is connected to Reference A, ensuring that transistors 240 is fully off and providing a second layer of isolation between the input and output of the switch 110. Further, transistor 220 is turned on such that the gate and the source of transistor 230 are shorted together (i.e., the gate-source voltage of transistor 230 is zero volts) ensuring that transistor 230 is fully off, preventing leakage currents between the drain of transistor 230 and Reference A (since transistors 270 is conducting), providing a third layer of isolation between the input and output of the switch 110.

Figure 3:
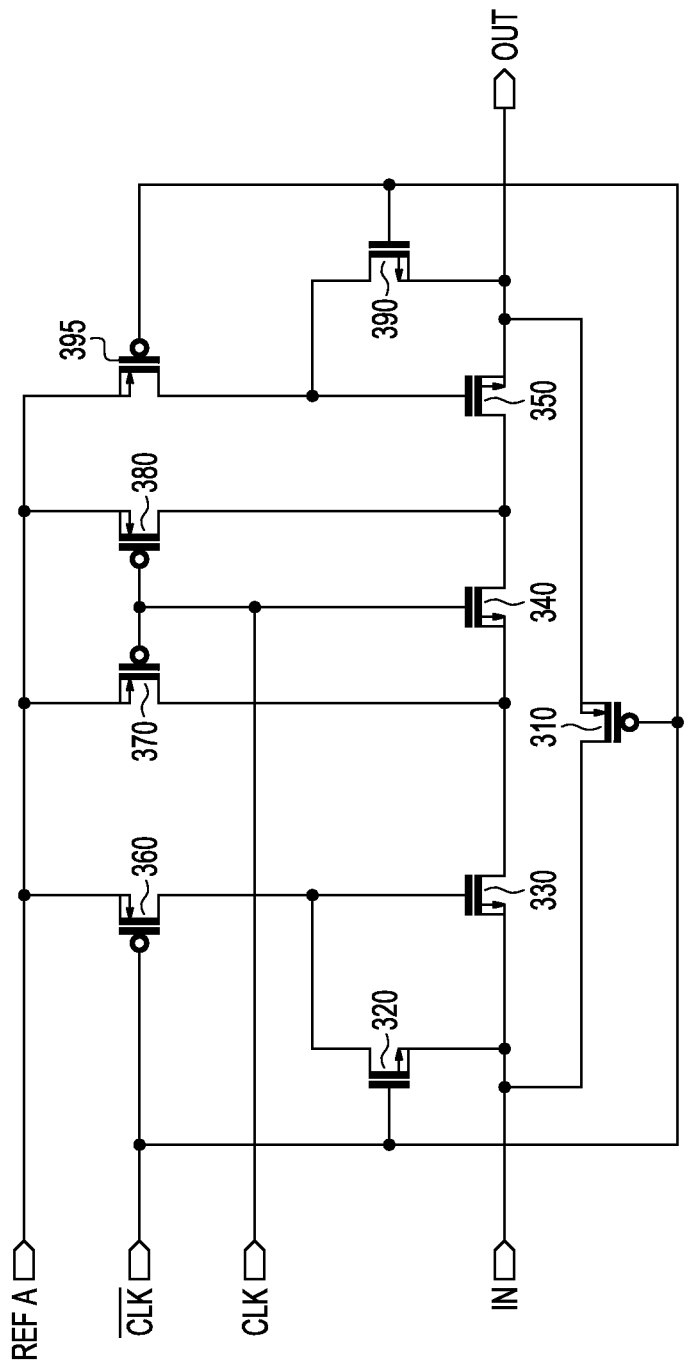
FIG. 3 is a circuit diagram illustrating another exemplary switch, in accordance with an embodiment.

FIG. 3 is a circuit diagram illustrating another exemplary switch 110, in accordance with an embodiment. The switch 110 may be used in a circuit 100 designed to sample signals below Reference A and below Reference B, as illustrated in FIG. 1. The switch 110 includes transistors 310-395, each of the transistors 310-395 have a gate a drain and a source. A drain and source of transistor 310 is coupled between the input to the switch 110 and the output of the switch 110. A gate of the transistor 310 is coupled to clockbar.

Transistors 330, 340 and 350 are arranged in series between the input of the switch 110 and the output of the switch 110. A source of transistor 330 is coupled to the input signal. The drain of transistor 330 is coupled to a source of transistor 340. The drain of transistor 340 is coupled to the drain of transistor 350. Lastly, the source of transistor 350 is coupled to the output of the switch 110.

Transistor 320 is coupled between a gate of transistor 330 and the input to the switch 110. A gate of the transistor 320 is also coupled to clockbar. Transistor 360 is coupled between Reference A and the gate of transistor 330. The gate of transistor 360 is coupled to clockbar. Transistor 370 is coupled between Reference A and the drain of transistor 330. Transistor 380 is coupled between Reference A and the drains of transistors 340 and 350. The gates of transistors 340, 370, and 380 are coupled to the clock control signal. Transistor 390 is coupled between a gate of transistor 350 and the output of the switch 110. A gate of transistor 390 is coupled to the clockbar signal. Transistor 395 is coupled between Reference A and the gate of transistor 350. The gate of transistor 395 is also coupled to the clockbar signal.

In operation, the switch 110 is closed (i.e., allowing current to flow between the input and the output of the switch 110) when the clock control signal is high and clockbar is low. When the clock control signal is high, transistors 330, 340 and 350 are conducting, passing signals from the input of the switch to the output of the switch, including signals that may have a voltage below Reference B. Transistors 360 and 395 are also turned on and are used to connect the gates of transistor 330 and 350, respectively, to Reference A so that transistors 330 and 350 are turned on fully. Transistor 310 may also conduct, passing signals from the input of the switch to the output of the switch, if the amplitude of the input signal is close to the Reference A voltage. In this stage, transistors 320, 370, 380 and 390 are all off (i.e., not conducting).

The switch 110 is opened when the clock control signal goes low and clockbar goes high. In this stage, transistors 310, 330, 340, 350, 360 and 395 are turned off such that the switch 110 is not passing the input signal to the output, providing a first layer of isolation between the input and the output of the switch 110. Furthermore, transistors 370 and 380 are turned on and are conducting such that the source and the drain of transistor 340 is connected to Reference A, ensuring that transistor 340 is fully off and providing a second layer of isolation between the input and output of the switch 110. Further, transistor 320 is turned on such that the gate and the source of transistor 330 are shorted together (i.e., the gate-source voltage of transistor 330 is zero volts) ensuring that transistor 330 is fully off, preventing leakage currents between the drain of transistor 330 and Reference A (since transistors 370 is conducting), providing a third layer of isolation between the input and output of the switch 110. Furthermore, transistor 390 is turned on such that the gate and the source of transistor 350 are shorted together (i.e., the gate-source voltage of transistor 350 is zero volts) ensuring that transistor 350 is fully off, preventing leakage currents between the drain of transistor 350 and Reference A (since transistors 380 is conducting), providing a fourth layer of isolation between the input and output of the switch 110. Furthermore, transistor 390 turns on, shorting the source and gate of transistor 350 so that transistor 350 is fully off even when the output is below ground.

Figure 4:
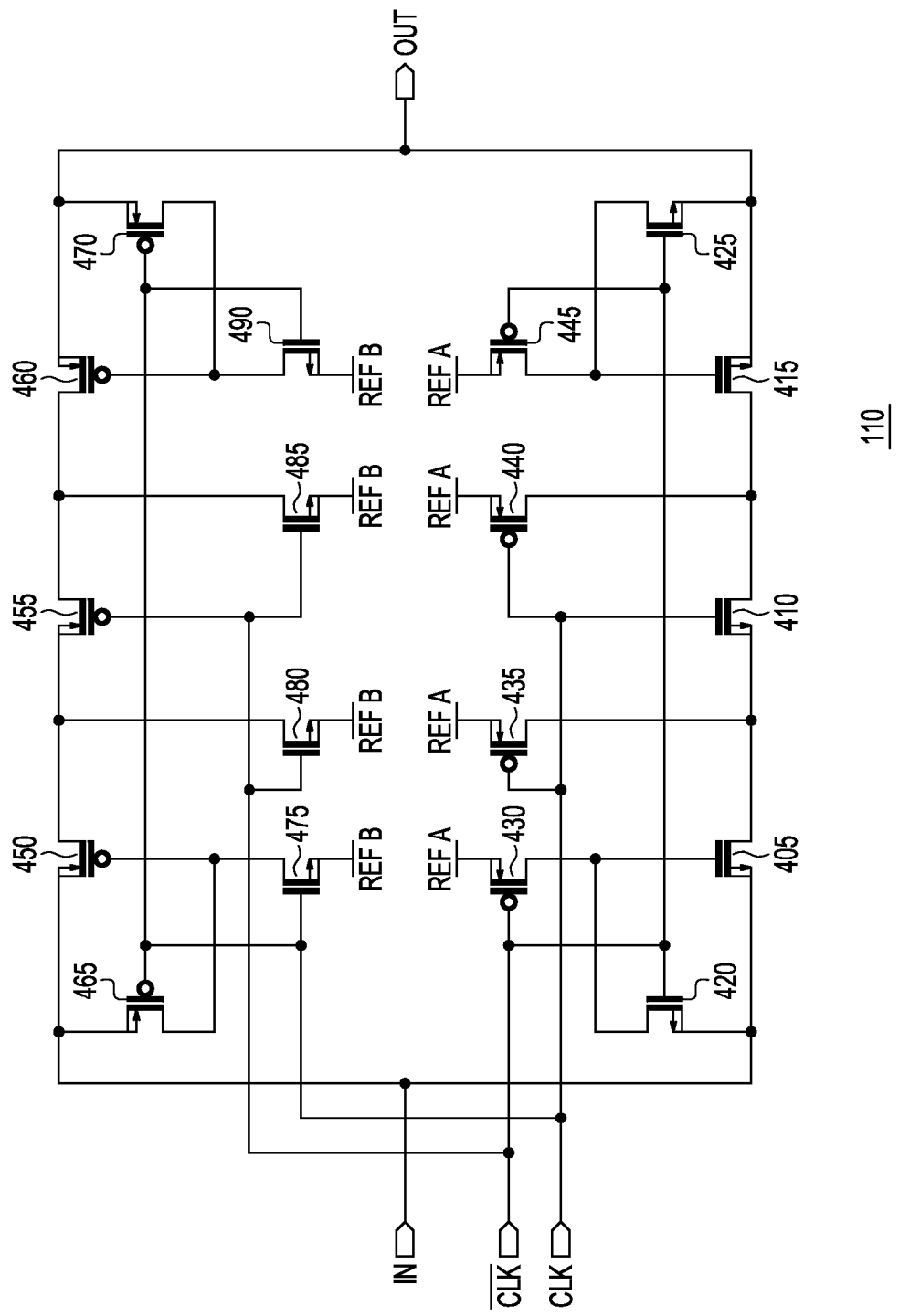
FIG. 4 is a circuit diagram illustrating another exemplary switch, in accordance with an embodiment.

FIG. 4 is a circuit diagram illustrating another exemplary switch 110, in accordance with an embodiment. The switch 110 may be used in a circuit 100 designed to sample signals above Reference A and below Reference B, as illustrated in FIG. 1. The switch 110 includes transistors 405-490, each of the transistors 405-490 have a gate a drain and a source. Transistors 405, 410 and 415 are arranged in series between the input of the switch 110 and the output of the switch 110. A source of transistor 405 is coupled to the input signal. The drain of transistor 405 is coupled to a source of transistor 410. The drain of transistor 410 is coupled to the drain of transistor 415. Lastly, the source of transistor 415 is coupled to the output of the switch 110.

Transistor 420 is coupled between the gate of transistor 405 and the input to the switch 110. A gate of the transistor 420 is also coupled to clockbar. Transistor 425 is coupled between the gate of transistor 415 and the output to the switch 110. A gate of the transistor 425 is also coupled to clockbar signal. Transistor 430 is coupled between Reference A and the gate of transistor 405. The gate of transistor 430 is also coupled to clockbar. Transistor 435 is coupled between Reference A and the drain of transistor 405. Transistor 440 is coupled between Reference A and the drains of transistors 410 and 415. The gates of transistors 410, 435, and 440 are coupled to the clock control signal. Transistor 445 is coupled between Reference A and the gate of transistor 415. The gate of transistor 445 is also coupled to the clockbar signal.

Transistors 450, 455 and 460 are arranged in series between the input of the switch 110 and the output of the switch 110. A source of transistor 450 is coupled to the input signal. The drain of transistor 450 is coupled to a source of transistor 455. The drain of transistor 455 is coupled to the drain of transistor 460. Lastly, the source of transistor 460 is coupled to the output of the switch 110.

Transistor 465 is coupled between the gate of transistor 450 and the input to the switch 110. A gate of the transistor 465 is also coupled to the clock control signal. Transistor 470 is coupled between the gate of transistor 460 and the output to the switch 110. A gate of the transistor 470 is also coupled to clock control signal. Transistor 475 is coupled between Reference B and the gate of transistor 450. The gate of transistor 475 is also coupled to the clock control signal. Transistor 480 is coupled between Reference B and the drain of transistor 450. Transistor 485 is coupled between Reference B and the drains of transistors 455 and 460. The gates of transistors 455, 480, and 485 are coupled to the clockbar signal. Transistor 490 is coupled between Reference B and the gate of transistor 460. The gate of transistor 490 is also coupled to the clock control signal.

In operation, the switch 110 is closed (i.e., allowing current to flow between the input and the output of the switch 110) when the clock control signal is high and clockbar is low. When the clock control signal is high, transistors 405, 410, 415, 450, 455 and 460 are conducting, passing signals from the input of the switch to the output of the switch, including signals that may have a voltage above Reference A and below Reference B. Transistors 430 and 445 are also turned on and are used to connect the gates of transistor 405 and 415, respectively, to Reference A so that transistors 405 and 415 are turned on fully. In this stage, transistors 420, 435, 440 and 425 are all off (i.e., not conducting). Likewise, transistors 475 and 490 are also turned on and are used to connect the gates of transistor 450 and 460, respectively, to Reference B so that transistors 450 and 460 are turned on fully. In this stage, transistors 465, 480, 485 and 470 are all off (i.e., not conducting).

The switch 110 is opened when the clock control signal goes low and clockbar goes high. In this stage, transistors 405, 410, 415, 430, 445, 450, 455, 460, 475 and 490 are turned off such that the switch 110 is not passing the input signal to the output, providing a first layer of isolation between the input and the output of the switch 110. Furthermore, transistors 435, 440, 480 and 485 are turned on and are conducting such that the source and the drain of transistor 410 is connected to Reference A, ensuring that transistors 410 is fully off, and the source and drain of transistor 455 is connected to reference B, ensuring that transistor 455 is fully off, providing a second layer of isolation between the input and output of the switch 110. Furthermore, transistor 420 is turned on such that the gate and the source of transistor 405 are shorted together (i.e., the gate-source voltage of transistor 405 is zero volts) ensuring that transistor 405 is fully off, preventing leakage currents between the drain of transistor 405 and Reference A (since transistors 435 is conducting), providing a third layer of isolation between the input and output of the switch 110. Likewise, transistor 465 is turned on such that the gate and the source of transistor 450 are shorted together (i.e., the gate-source voltage of transistor 450 is zero volts) ensuring that transistor 450 is fully off, preventing leakage currents between the drain of transistor 450 and Reference A (since transistors 480 is conducting), providing the third layer of isolation between the input and output of the switch 110 along the upper path illustrated in FIG. 4. Furthermore, transistor 425 is turned on such that the gate and the source of transistor 415 are shorted together (i.e., the gate-source voltage of transistor 415 is zero volts) and transistor 470 is turned on such that the gate and source of transistor 460 are shorted together, ensuring that transistors 425 and 460 are fully off, preventing leakage currents between the drain of transistor 425 and Reference A (since transistors 440 is conducting) and between the drain of transistor 460 and Reference B (since transistor 485 is conducting), providing a fourth layer of isolation between the input and output of the switch 110. While FIG. 4 illustrates a switch 110 utilizing transistors 425, 445, 470 and 490, one of ordinary skill in the art would recognize that the switch 110 illustrated in FIG. 4 could be reconfigured without those transistors as illustrated in FIG. 2.

Figure 5:
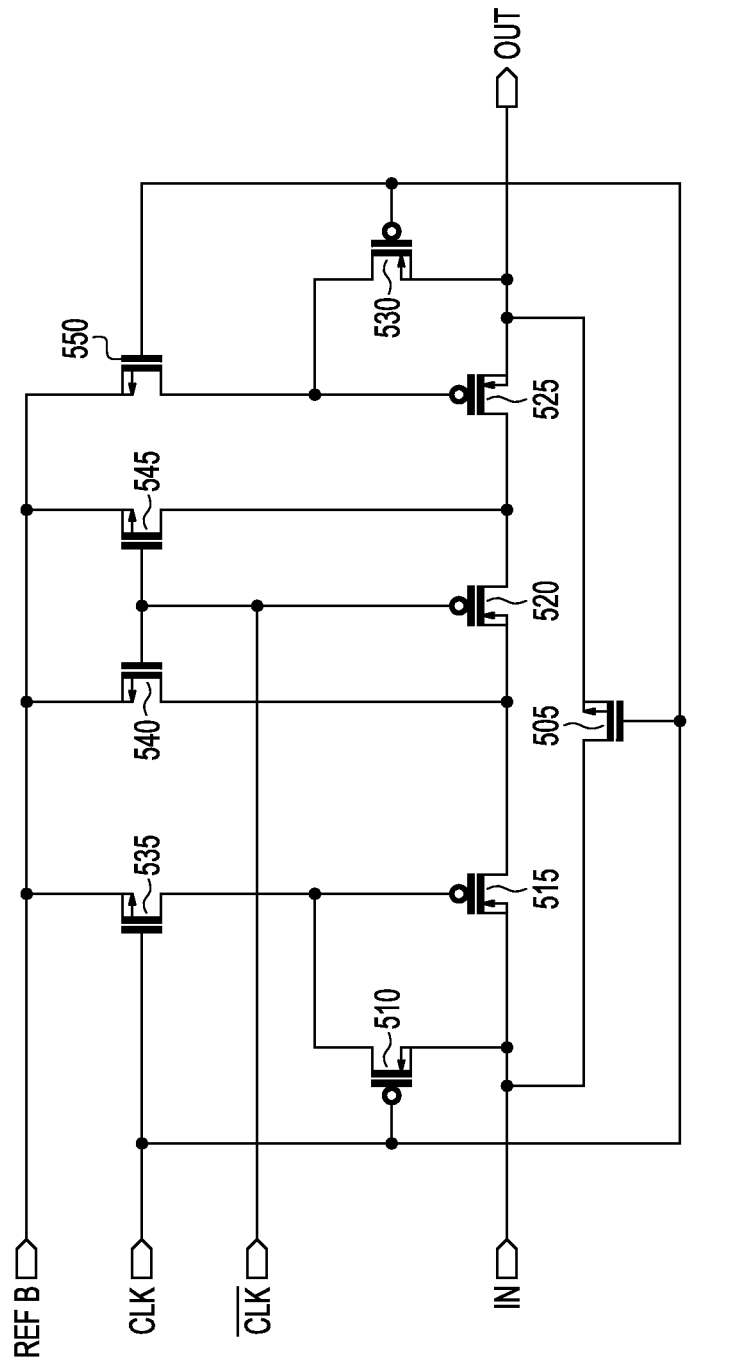
FIG. 5 is a circuit diagram illustrating yet another exemplary switch, in accordance with an embodiment.

FIG. 5 is a circuit diagram illustrating another exemplary switch 110, in accordance with an embodiment. The switch 110 may be used in a circuit 100 designed to sample signals above Reference A and above Reference B, as illustrated in FIG. 1. The switch 110 includes transistors 505-550, each of the transistors 505-550 have a gate, a drain, a source and a bulk connection. A drain and source of transistor 505 is coupled between the input to the switch 110 and the output of the switch 110. A gate of the transistor 505 is coupled to the clock signal.

Transistors 515, 520 and 525 are arranged in series between the input of the switch 110 and the output of the switch 110. A source of transistor 515 is coupled to the input signal. The drain of transistor 515 is coupled to a source of transistor 520. The drain of transistor 520 is coupled to the drain of transistor 525. Lastly, the source of transistor 525 is coupled to the output of the switch 110.

Transistor 510 is coupled between a gate of transistor 515 and the input to the switch 110. A gate of the transistor 510 is also coupled to the clock signal. Transistor 535 is coupled between Reference B and the gate of transistor 515. The gate of transistor 535 is coupled to the clock signal. Transistor 520 is coupled between Reference B and the drain of transistor 515. Transistor 545 is coupled between Reference B and the drains of transistors 520 and 525. The gates of transistors 520, 540, and 545 are coupled to the clockbar control signal. Transistor 530 is coupled between a gate of transistor 525 and the output of the switch 110. A gate of transistor 530 is coupled to the clock signal. Transistor 550 is coupled between Reference B and the gate of transistor 525. The gate of transistor 550 is also coupled to the clock signal.

In operation, the switch 110 is closed (i.e., allowing current to flow between the input and the output of the switch 110) when the clock control signal is high and clockbar is low. When the clock control signal is high, transistors 515, 520 and 525 are conducting, passing signals from the input of the switch to the output of the switch, including signals that may have a voltage above Reference A. Transistors 535 and 550 are also turned on and are used to connect the gates of transistor 515 and 525, respectively, to Reference B so that transistors 515 and 525 are turned on fully. Transistor 505 may also conduct, passing signals from the input of the switch to the output of the switch, if the amplitude of the input signal is close to the Reference B voltage. In this stage, transistors 510, 540, 545 and 530 are all off (i.e., not conducting)

The switch 110 is opened when the clock control signal goes low and clockbar goes high. In this stage, transistors 505, 515, 520, 525, 535 and 550 are turned off such that the switch 110 is not passing the input signal to the output, providing a first layer of isolation between the input and the output of the switch 110. Furthermore, transistors 540 and 545 are turned on and are conducting such that the source and the drain of transistor 520 is connected to Reference B, ensuring that transistor 520 is fully off and providing a second layer of isolation between the input and output of the switch 110. Further, transistor 510 is turned on such that the gate and the source of transistor 515 are shorted together (i.e., the gate-source voltage of transistor 515 is zero volts) ensuring that transistor 515 is fully off, even when the input voltage is above Reference A, preventing leakage currents between the drain of transistor 515 and Reference B (since transistors 540 is conducting), providing a third layer of isolation between the input and output of the switch 110. Furthermore, transistor 530 is turned on such that the gate and the source of transistor 525 are shorted together (i.e., the gate-source voltage of transistor 525 is zero volts) ensuring that transistor 525 is fully off, preventing leakage currents between the drain of transistor 525 and Reference B (since transistors 545 is conducting), providing a fourth layer of isolation between the input and output of the switch 110.

In one embodiment, for example, a switch having an input and an output is provided. The switch may include, but is not limited to, a plurality of transistors, wherein the plurality of transistors are configured to provide at least one paths between the input and the output of the switch and wherein the plurality of transistors are configured to provide at least three layers of electrical isolation between the input and the output of the switch along the at least one path when the switch is open. In one embodiment, for example, the switch may be configured to receive a ground reference voltage, wherein when the switch is closed, the switch is configured to pass a signal even when a voltage of the signal is below the ground reference voltage. In another embodiment, for example, the switch may be configured to receive a power supply reference voltage wherein, wherein when the switch is closed, the switch is configured to pass a signal even when a voltage of the signal is above the power supply reference voltage. The at least one path may include a first transistor having a control electrode, a first current electrode and a second current electrode, wherein the first current electrode of the first transistor is configured to be coupled to the input of the switch, a second transistor having a control electrode, a first current electrode and a second current electrode, wherein the first current electrode of the second transistor is configured to be coupled to the second current electrode of the first transistor, and a third transistor having a control electrode, a first current electrode and a second current electrode, wherein the second current electrode of the third transistor is configured to be coupled to the second current electrode of the second transistor and the first current electrode of the third transistor is configured to be coupled to the output of the switch. In one embodiment, for example, the switch is configured to receive a first reference voltage and the plurality of transistors further includes a fourth transistor having a control electrode, a first current electrode and a second current electrode, wherein the first current electrode of the fourth transistor is configured to be coupled to the first current electrode of the first transistor and the second current electrode of the fourth transistor is configured to be coupled to the control electrode of the first transistor, a fifth transistor having a control electrode, a first current electrode and a second current electrode, wherein the first current electrode of the fifth transistor is configured to be coupled to the first reference voltage and the second current electrode of the fifth transistor is configured to be coupled to the control electrode of the first transistor, a sixth transistor having a control electrode, a first current electrode and a second current electrode, wherein the wherein the first current electrode of the sixth transistor is configured to be coupled to the first reference voltage and the second current electrode of the sixth transistor is configured to be coupled to the second current electrode of the first transistor, and a seventh transistor having a control electrode, a first current electrode and a second current electrode, wherein the wherein the first current electrode of the seventh transistor is configured to be coupled to the first reference voltage and the second current electrode of the seventh transistor is configured to be coupled to the second current electrode of the second transistor. In one embodiment, for example, the plurality of transistors further includes an eighth transistor having a control electrode, a first current electrode and a second current electrode, wherein the first current electrode of the eighth transistor is configured to be coupled to the first current electrode of the third transistor and the second current electrode of the eighth transistor is configured to be coupled to a control electrode of the third transistor, and a ninth transistor having a control electrode, a first current electrode and a second current electrode, wherein the wherein the first current electrode of the ninth transistor is configured to be coupled to the first reference voltage and the second current electrode of the ninth transistor is configured to be coupled to the control electrode of the third transistor. In one embodiment, for example, the switch is configured to receive a first clock control signal and a second clock control signal which is an inverse of the first clock control signal, wherein the control electrode of the second transistor, the control electrode of the sixth transistor, and the control electrode of the seventh transistor are configured to be coupled to the first clock control signal and the control electrode of the fourth transistor, the control electrode of the fifth transistor, the control electrode of the eighth transistor and the control electrode of the ninth transistor are configured to be coupled to the second clock control signal. In one embodiment, for example, a second path of the at least one path comprises a fourth transistor having a control electrode, a first current electrode and a second current electrode, wherein the second current electrode of the fourth transistor is configured to be coupled to the input of the switch and the first current electrode of the fourth transistor is configured to be coupled to the output of the switch and the tenth transistor is configured to be coupled to the second control signal. In another embodiment, for example, a second path of the at least one path includes a fourth transistor having a control electrode, a first current electrode and a second current electrode, wherein the first current electrode of the fourth transistor is configured to be coupled to the input of the switch, an fifth transistor having a control electrode, a first current electrode and a second current electrode, wherein the first current electrode of the fifth transistor is configured to be coupled to the second current electrode of the fourth transistor, and a sixth transistor having a control electrode, a first current electrode and a second current electrode, wherein the second current electrode of the sixth transistor is configured to be coupled to the second current electrode of the fifth transistor and the first current electrode of the sixth transistor is configured to be coupled to the output of the switch. The switch may be configured to receive a second reference voltage and the plurality of transistors further includes a seventh transistor having a control electrode, a first current electrode and a second current electrode, wherein the first current electrode of the seventh transistor is configured to be coupled to the first current electrode of the fourth transistor and the second current electrode of the seventh transistor is configured to be coupled to the control electrode of the fourth transistor, an eighth transistor having a control electrode, a first current electrode and a second current electrode, wherein the first current electrode of the eighth transistor is configured to be coupled to the second reference voltage and the second current electrode of the eighth transistor is configured to be coupled to the control electrode of the fourth transistor, a ninth transistor having a control electrode, a first current electrode and a second current electrode, wherein the wherein the first current electrode of the ninth transistor is configured to be coupled to the second reference voltage and the second current electrode of the ninth transistor is configured to be coupled to the second current electrode of the fourth transistor, and a tenth transistor having a control electrode, a first current electrode and a second current electrode, wherein the wherein the first current electrode of the tenth transistor is configured to be coupled to the second reference voltage and the second current electrode of the tenth transistor is configured to be coupled to the second current electrode of the fifth transistor. The plurality of transistors may further include a eleventh transistor having a control electrode, a first current electrode and a second current electrode, wherein the first current electrode of the eleventh transistor is configured to be coupled to the first current electrode of the sixth transistor and the second current electrode of the eleventh transistor is configured to be coupled to the control electrode of the sixth transistor, and a twelfth transistor having a control electrode, a first current electrode and a second current electrode, wherein the wherein the first current electrode of the twelfth transistor is configured to be coupled to the second reference voltage and the second current electrode of the twelfth transistor is configured to be coupled to the control electrode of the sixth transistor. In one embodiment, for example, the control electrode of the seventh transistor, the control electrode of the eighth transistor, the control electrode of the eleventh transistor, and the control electrode of the twelfth transistor are configured to be coupled to a first control signal and the control electrode of the fifth transistor, the control electrode of the ninth transistor, and the control electrode of the tenth transistor are configured to be coupled to a second control signal. In one embodiment, for example, when the switch is open, the first transistor, the second transistor, the third transistor, and the fifth transistor are configured to be turned off by one of the first control signal and the second control signal to provide a first layer of electrical isolation between the input and the output of the switch, wherein when the switch is open, the sixth transistor and the seventh transistor are configured to be turned on by the first control signal to provide a second layer of electrical isolation between the input and the output of the switch, wherein when the switch is open, the fourth transistor is configured to be turned on by the second control signal to provide a third layer of electrical isolation between the input and the output of the switch, and wherein when the switch is open, the eighth transistor and the ninth transistor are configured to be turned on by the second control signal to provide a fourth layer of electrical isolation between the input and the output of the switch. In one embodiment, for example, the switch may be coupled to a measurement system for sampling an input signal.

In another embodiment, for example, a switch configured to receive an input signal is provided. The switch may include, but is not limited to a path between an input of the switch and an output of the switch, the path including a first transistor having a control electrode, a first current electrode and a second current electrode, wherein the first current electrode of the first transistor is configured to be coupled to an input of the switch, a second transistor having a control electrode, a first current electrode and a second current electrode, wherein the first current electrode of the second transistor is configured to be coupled to the second current electrode of the first transistor, and a third transistor having a control electrode, a first current electrode and a second current electrode, wherein the second current electrode of the third transistor is configured to be coupled to the second current electrode of the second transistor and the first current electrode of the third transistor is configured to be coupled to an output of the switch, and a plurality of electrically isolating transistors, including a fourth transistor having a control electrode, a first current electrode and a second current electrode, wherein the first current electrode of the fourth transistor is configured to be coupled to the first current electrode of the first transistor and the second current electrode of the fourth transistor is configured to be coupled to the control electrode of the first transistor, a fifth transistor having a control electrode, a first current electrode and a second current electrode, wherein the first current electrode of the fifth transistor is configured to be coupled to the first reference voltage and the second current electrode of the fifth transistor is configured to be coupled to the control electrode of the first transistor, a sixth transistor having a control electrode, a first current electrode and a second current electrode, wherein the wherein the first current electrode of the sixth transistor is configured to be coupled to the first reference voltage and the second current electrode of the sixth transistor is configured to be coupled to the second current electrode of the first transistor, and a seventh transistor having a control electrode, a first current electrode and a second current electrode, wherein the wherein the first current electrode of the seventh transistor is configured to be coupled to the first reference voltage and the second current electrode of the seventh transistor is configured to be coupled to the second current electrode of the second transistor. In one embodiment, for example, the switch further includes an eighth transistor having a control electrode, a first current electrode and a second current electrode, wherein the second current electrode of the eighth transistor is configured to be coupled to the input of the switch and the first current electrode of the eighth transistor is configured to be coupled to the output of the switch. In another embodiment, for example, the switch further includes an eighth transistor having a control electrode, a first current electrode and a second current electrode, wherein the first current electrode of the eighth transistor is configured to be coupled to the first current electrode of the third transistor and the second current electrode of the eighth transistor is configured to be coupled to the control electrode of the third transistor, a ninth transistor having a control electrode, a first current electrode and a second current electrode, wherein the wherein the first current electrode of the ninth transistor is configured to be coupled to the first reference voltage and the second current electrode of the ninth transistor is configured to be coupled to the control electrode of the third transistor, a tenth transistor having a control electrode, a first current electrode and a second current electrode, wherein the first current electrode of the tenth transistor is configured to be coupled to the input of the switch, an eleventh transistor having a control electrode, a first current electrode and a second current electrode, wherein the first current electrode of the eleventh transistor is configured to be coupled to the second current electrode of the tenth transistor, a twelfth transistor having a control electrode, a first current electrode and a second current electrode, wherein the second current electrode of the twelfth transistor is configured to be coupled to the second current electrode of the eleventh transistor and the first current electrode of the twelfth transistor is configured to be coupled to the output of the switch, a thirteenth transistor having a control electrode, a first current electrode and a second current electrode, wherein the first current electrode of the thirteenth transistor is configured to be coupled to the first current electrode of the tenth transistor and the second current electrode of the thirteenth transistor is configured to be coupled to the control electrode of the tenth transistor, a fourteenth transistor having a control electrode, a first current electrode and a second current electrode, wherein the first current electrode of the fourteenth transistor is configured to be coupled to the second reference voltage and the second current electrode of the fourteenth transistor is configured to be coupled to the control electrode of the tenth transistor, a fifteenth transistor having a control electrode, a first current electrode and a second current electrode, wherein the wherein the first current electrode of the fifteenth transistor is configured to be coupled to the second reference voltage and the second current electrode of the fifteenth transistor is configured to be coupled to the second current electrode of the tenth transistor, a sixteenth transistor having a control electrode, a first current electrode and a second current electrode, wherein the wherein the first current electrode of the sixteenth transistor is configured to be coupled to the second reference voltage and the second current electrode of the sixteenth transistor is configured to be coupled to the second current electrode of the eleventh transistor, a seventeenth transistor having a control electrode, a first current electrode and a second current electrode, wherein the first current electrode of the seventeenth transistor is configured to be coupled to the first current electrode of the twelfth transistor and the second current electrode of the seventeenth transistor is configured to be coupled to the control electrode of the twelfth transistor, and an eighteenth transistor having a control electrode, a first current electrode and a second current electrode, wherein the wherein the first current electrode of the eighteenth transistor is configured to be coupled to the second reference voltage and the second current electrode of the eighteenth transistor is configured to be coupled to the control electrode of the twelfth transistor.

The term "exemplary" is used herein to represent one example, instance or illustration that may have any number of alternates. Any implementation described herein as "exemplary" should not necessarily be construed as preferred or advantageous over other implementations.

Although several exemplary embodiments have been presented in the foregoing description, it should be appreciated that a vast number of alternate but equivalent variations exist, and the examples presented herein are not intended to limit the scope, applicability, or configuration of the embodiments in any way. To the contrary, various changes may be made in the function and arrangement of the various features described herein without departing from the scope of the claims and their legal equivalents.

What is claimed is:

1. A switch having an input and an output, comprising:
   a plurality of transistors, wherein the plurality of transistors are configured to provide at least one paths between the input and the output of the switch and wherein the plurality of transistors are configured to provide at least three layers of electrical isolation between the input and the output of the switch along the at least one path when the switch is open,
   wherein the at least one path comprises:
   a first transistor having a control electrode, a first current electrode and a second current electrode, wherein the first current electrode of the first transistor is configured to be coupled to the input of the switch;
   a second transistor having a control electrode, a first current electrode and a second current electrode, wherein the first current electrode of the second transistor is configured to be coupled to the second current electrode of the first transistor; and
   a third transistor having a control electrode, a first current electrode and a second current electrode, wherein the second current electrode of the third transistor is configured to be coupled to the second current electrode of the second transistor and the first current electrode of the third transistor is configured to be coupled to the output of the switch,
   wherein the switch is configured to receive a first reference voltage and the plurality of transistors further comprises:
      a fourth transistor having a control electrode, a first current electrode and a second current electrode, wherein the first current electrode of the fourth transistor is configured to be coupled to the first current electrode of the first transistor and the second current electrode of the fourth transistor is configured to be coupled to the control electrode of the first transistor;
      a fifth transistor having a control electrode, a first current electrode and a second current electrode, wherein the first current electrode of the fifth transistor is configured to be coupled to the first reference voltage and the second current electrode of the fifth transistor is configured to be coupled to the control electrode of the first transistor;
      a sixth transistor having a control electrode, a first current electrode and a second current electrode, wherein the first current electrode of the sixth transistor is configured to be coupled to the first reference voltage and the second current electrode of the sixth transistor is configured to be coupled to the second current electrode of the first transistor; and
      a seventh transistor having a control electrode, a first current electrode and a second current electrode, wherein the first current electrode of the seventh transistor is configured to be coupled to the first reference voltage and the second current electrode of the seventh transistor is configured to be coupled to the second current electrode of the second transistor.

2. The switch of claim 1, wherein the switch is configured to receive a ground reference voltage, wherein when the switch is closed, the switch is configured to pass a signal even when a voltage of the signal is below the ground reference voltage.

3. The switch of claim 1, wherein the switch is configured to receive a power supply reference voltage, wherein when the switch is closed, the switch is configured to pass a signal even when a voltage of the signal is above the power supply reference voltage.

4. The switch of claim 1, wherein plurality of transistors further comprises:
   an eighth transistor having a control electrode, a first current electrode and a second current electrode, wherein the first current electrode of the eighth transistor is configured to be coupled to the first current electrode of the third transistor and the second current electrode of the eighth transistor is configured to be coupled to a control electrode of the third transistor; and
   a ninth transistor having a control electrode, a first current electrode and a second current electrode, wherein the first current electrode of the ninth transistor is configured to be coupled to the first reference voltage and the second current electrode of the ninth transistor is configured to be coupled to the control electrode of the third transistor.

5. The switch of claim 4, wherein the switch is configured to receive a first clock control signal and a second clock control signal which is an inverse of the first clock control signal, wherein the control electrode of the second transistor, the control electrode of the sixth transistor, and the control electrode of the seventh transistor are configured to be coupled to the first clock control signal and the control electrode of the fourth transistor, the control electrode of the fifth transistor, the control electrode of the eighth transistor and the control electrode of the ninth transistor are configured to be coupled to the second clock control signal.

6. The switch of claim 1, wherein a second path of the at least one path comprises a fourth transistor having a control electrode, a first current electrode and a second current electrode, wherein the second current electrode of the fourth transistor is configured to be coupled to the input of the switch and the first current electrode of the fourth transistor is configured to be coupled to the output of the switch and the control electrode of the fourth transistor tenth transistor is configured to be coupled to a second clock control signal.

7. The switch of claim 1, wherein a second path of the at least one path comprises:
   a fourth transistor having a control electrode, a first current electrode and a second current electrode, wherein the first current electrode of the fourth transistor is configured to be coupled to the input of the switch;

an fifth transistor having a control electrode, a first current electrode and a second current electrode, wherein the first current electrode of the fifth transistor is configured to be coupled to the second current electrode of the fourth transistor; and a sixth transistor having a control electrode, a first current electrode and a second current electrode, wherein the second current electrode of the sixth transistor is configured to be coupled to the second current electrode of the fifth transistor and the first current electrode of the sixth transistor is configured to be coupled to the output of the switch.

8. The switch of claim 7, wherein the switch is configured to receive a second reference voltage and the plurality of transistors further comprises:

a seventh transistor having a control electrode, a first current electrode and a second current electrode, wherein the first current electrode of the seventh transistor is configured to be coupled to the first current electrode of the fourth transistor and the second current electrode of the seventh transistor is configured to be coupled to the control electrode of the fourth transistor;

an eighth transistor having a control electrode, a first current electrode and a second current electrode, wherein the first current electrode of the eighth transistor is configured to be coupled to the second reference voltage and the second current electrode of the eighth transistor is configured to be coupled to the control electrode of the fourth transistor;

a ninth transistor having a control electrode, a first current electrode and a second current electrode, wherein the first current electrode of the ninth transistor is configured to be coupled to the second reference voltage and the second current electrode of the ninth transistor is configured to be coupled to the second current electrode of the fourth transistor; and a tenth transistor having a control electrode, a first current electrode and a second current electrode, wherein the first current electrode of the tenth transistor is configured to be coupled to the second reference voltage and the second current electrode of the tenth transistor is configured to be coupled to the second current electrode of the fifth transistor.

9. The switch of claim 8, wherein the plurality of transistors further comprises:

an eleventh transistor having a control electrode, a first current electrode and a second current electrode, wherein the first current electrode of the eleventh transistor is configured to be coupled to the first current electrode of the sixth transistor and the second current electrode of the eleventh transistor is configured to be coupled to the control electrode of the sixth transistor; and a twelfth transistor having a control electrode, a first current electrode and a second current electrode, wherein the first current electrode of the twelfth transistor is configured to be coupled to the second reference voltage and the second current electrode of the twelfth transistor is configured to be coupled to the control electrode of the sixth transistor.

10. The switch of claim 9, wherein the control electrode of the seventh transistor, the control electrode of the eighth transistor, the control electrode of the eleventh transistor, and the control electrode of the twelfth transistor are configured to be coupled to a first control signal and the control electrode of the fifth transistor, the control electrode of the ninth transistor, and the control electrode of the tenth transistor are configured to be coupled to a second control signal.

11. The switch of claim 5, wherein when the switch is open, the first transistor, the second transistor, the third transistor, and the fifth transistor are configured to be turned off by one of the first control signal and the second control signal to provide a first layer of electrical isolation between the input and the output of the switch.

12. The switch of claim 11, wherein when the switch is open, the sixth transistor and the seventh transistor are configured to be turned on by the first control signal to provide a second layer of electrical isolation between the input and the output of the switch.

13. The switch of claim 12, wherein when the switch is open, the fourth transistor is configured to be turned on by the second control signal to provide a third layer of electrical isolation between the input and the output of the switch.

14. The switch of claim 13, wherein when the switch is open, the eighth transistor and the ninth transistor are configured to be turned on by the second control signal to provide a fourth layer of electrical isolation between the input and the output of the switch.

15. The switch of claim 1, wherein the switch is coupled to a measurement system for sampling an input signal.

16. A switch configured to receive an input signal, the switch comprising:

a path between an input of the switch and an output of the switch, the path comprising:

a first transistor having a control electrode, a first current electrode and a second current electrode, wherein the first current electrode of the first transistor is configured to be coupled to an input of the switch;

a second transistor having a control electrode, a first current electrode and a second current electrode, wherein the first current electrode of the second transistor is configured to be coupled to the second current electrode of the first transistor; and a third transistor having a control electrode, a first current electrode and a second current electrode, wherein the second current electrode of the third transistor is configured to be coupled to the second current electrode of the second transistor and the first current electrode of the third transistor is configured to be coupled to an output of the switch;

a plurality of electrically isolating transistors, comprising:

a fourth transistor having a control electrode, a first current electrode and a second current electrode, wherein the first current electrode of the fourth transistor is configured to be coupled to the first current electrode of the first transistor and the second current electrode of the fourth transistor is configured to be coupled to the control electrode of the first transistor;

a fifth transistor having a control electrode, a first current electrode and a second current electrode, wherein the first current electrode of the fifth transistor is configured to be coupled to the first reference voltage and the second current electrode of the fifth transistor is configured to be coupled to the control electrode of the first transistor;

a sixth transistor having a control electrode, a first current electrode and a second current electrode, wherein the first current electrode of the sixth transistor is configured to be coupled to the first reference voltage and the second current electrode of the sixth transistor is configured to be coupled to the second current electrode of the first transistor; and a seventh transistor having a control electrode, a first current electrode and a second current electrode, wherein the first current electrode of the seventh transistor is configured to be coupled to the first reference voltage and the second current electrode of the seventh transistor is configured to be coupled to the second current electrode of the second transistor.

17. The sampling circuit of claim 16, wherein the switch further comprising an eighth transistor having a control electrode, a first current electrode and a second current electrode, wherein the second current electrode of the eighth transistor is configured to be coupled to the input of the switch and the first current electrode of the eighth transistor is configured to be coupled to the output of the switch.

18. The sampling circuit of claim 16, wherein the switch further comprises:

an eighth transistor having a control electrode, a first current electrode and a second current electrode, wherein the first current electrode of the eighth transistor is configured to be coupled to the first current electrode of the third transistor and the second current electrode of the eighth transistor is configured to be coupled to the control electrode of the third transistor;

a ninth transistor having a control electrode, a first current electrode and a second current electrode, wherein the first current electrode of the ninth transistor is configured to be coupled to the first reference voltage and the second current electrode of the ninth transistor is configured to be coupled to the control electrode of the third transistor;

a tenth transistor having a control electrode, a first current electrode and a second current electrode, wherein the first current electrode of the tenth transistor is configured to be coupled to the input of the switch;

an eleventh transistor having a control electrode, a first current electrode and a second current electrode, wherein the first current electrode of the eleventh transistor is configured to be coupled to the second current electrode of the tenth transistor;

a twelfth transistor having a control electrode, a first current electrode and a second current electrode, wherein the second current electrode of the twelfth transistor is configured to be coupled to the second current electrode of the eleventh transistor and the first current electrode of the twelfth transistor is configured to be coupled to the output of the switch;

a thirteenth transistor having a control electrode, a first current electrode and a second current electrode, wherein the first current electrode of the thirteenth transistor is configured to be coupled to the first current electrode of the tenth transistor and the second current electrode of the thirteenth transistor is configured to be coupled to the control electrode of the tenth transistor;

a fourteenth transistor having a control electrode, a first current electrode and a second current electrode, wherein the first current electrode of the fourteenth transistor is configured to be coupled to the second reference voltage and the second current electrode of the fourteenth transistor is configured to be coupled to the control electrode of the tenth transistor;

a fifteenth transistor having a control electrode, a first current electrode and a second current electrode, wherein the first current electrode of the fifteenth transistor is configured to be coupled to the second reference voltage and the second current electrode of the fifteenth transistor is configured to be coupled to the second current electrode of the tenth transistor;

a sixteenth transistor having a control electrode, a first current electrode and a second current electrode, wherein the first current electrode of the sixteenth transistor is configured to be coupled to the second reference voltage and the second current electrode of the sixteenth transistor is configured to be coupled to the second current electrode of the eleventh transistor;

a seventeenth transistor having a control electrode, a first current electrode and a second current electrode, wherein the first current electrode of the seventeenth transistor is configured to be coupled to the first current electrode of the twelfth transistor and the second current electrode of the seventeenth transistor is configured to be coupled to the control electrode of the twelfth transistor; and an eighteenth transistor having a control electrode, a first current electrode and a second current electrode, wherein the first current electrode of the eighteenth transistor is configured to be coupled to the second reference voltage and the second current electrode of the eighteenth transistor is configured to be coupled to the control electrode of the twelfth transistor.

\* \* \* \* \*